(12) United States Patent
Cocchi et al.

(10) Patent No.: US 8,111,089 B2
(45) Date of Patent: Feb. 7, 2012

(54) BUILDING BLOCK FOR A SECURE CMOS LOGIC CELL LIBRARY

(75) Inventors: Ronald P. Cocchi, Seal Beach, CA (US); James P. Baukus, Westlake Village, CA (US); Bryan J. Wang, S. Lake Tahoe, CA (US); Lap Wai Chow, S. Pasadena, CA (US); Paul Ouyang, San Jose, CA (US)

(73) Assignees: Syphermedia International, Inc., Westminster, CA (US); Promtek Programmable Memory Technology, Inc., San Jose, CA (US)

( * ) Notice: Subject to any disclaimer, the term of this patent is extended or adjusted under 35 U.S.C. 154(b) by 0 days.

(21) Appl. No.: 12/786,205

(22) Filed: May 24, 2010

(65) Prior Publication Data

US 2010/0301903 A1    Dec. 2, 2010

Related U.S. Application Data

(60) Provisional application No. 61/181,930, filed on May 28, 2009.

(51) Int. Cl.
*H03K 19/00* (2006.01)
*H03K 19/20* (2006.01)
*H03K 19/094* (2006.01)

(52) U.S. Cl. .............................. 326/121; 326/113; 326/8

(58) Field of Classification Search ................. 326/9–12, 326/37–41, 47, 93–95, 104, 112, 113, 121, 326/122; 327/22–27, 108

See application file for complete search history.

(56) References Cited

U.S. PATENT DOCUMENTS

| | | | |
|---|---|---|---|
| 5,636,133 | A | 6/1997 | Chesebro et al. |
| 5,783,846 | A | 7/1998 | Baukus et al. |
| 5,866,933 | A | 2/1999 | Baukus et al. |
| 5,930,663 | A | 7/1999 | Baukus et al. |
| 5,973,375 | A | 10/1999 | Baukus et al. |
| 6,064,110 | A | 5/2000 | Baukus et al. |
| 6,117,762 | A | 9/2000 | Baukus et al. |
| 6,294,816 | B1 | 9/2001 | Baukus et al. |
| 6,305,000 | B1 | 10/2001 | Phan et al. |
| 6,351,172 | B1 * | 2/2002 | Ouyang et al. ................ 327/333 |
| 6,459,629 | B1 | 10/2002 | Clark, Jr. et al. |
| 6,467,074 | B1 | 10/2002 | Katsioulas et al. |
| 6,613,661 | B1 | 9/2003 | Baukus et al. |
| 6,740,942 | B2 | 5/2004 | Baukus et al. |
| 6,748,579 | B2 | 6/2004 | Dillon et al. |
| 6,774,413 | B2 | 8/2004 | Baukus et al. |
| 6,791,191 | B2 | 9/2004 | Chow et al. |
| 6,815,816 | B1 | 11/2004 | Clark, Jr. et al. |
| 6,893,916 | B2 | 5/2005 | Baukus et al. |
| 6,897,535 | B2 | 5/2005 | Chow et al. |
| 6,919,600 | B2 | 7/2005 | Baukus et al. |
| 6,924,552 | B2 | 8/2005 | Baukus et al. |
| 6,940,764 | B2 | 9/2005 | Clark, Jr. et al. |

(Continued)

*Primary Examiner* — Shawki S Ismail
*Assistant Examiner* — Dylan White
(74) *Attorney, Agent, or Firm* — Gates & Cooper LLP

(57) ABSTRACT

A logical building block and method of using the building block to design a logic cell library for CMOS (Complementary Metal Oxide Silicon) ASICs (Application Specific Integrated Circuits) is disclosed. Different logic gates, built with the same building block as described in this invention, will have the same schematics of transistor connection and also the same physical layout so that they appear to be physically identical under optical or electron microscopy. An ASIC designed from a library of such logic cells is strongly resistant to a reverse engineering attempt.

19 Claims, 13 Drawing Sheets

Logic Programming of basic logic block with camouflage

U.S. PATENT DOCUMENTS

| | | | |
|---|---|---|---|
| 6,944,843 B2 | 9/2005 | Bansal | |
| 6,979,606 B2 | 12/2005 | Chow et al. | |
| 7,008,873 B2 | 3/2006 | Chow et al. | |
| 7,009,443 B2 * | 3/2006 | Illegems | 327/525 |
| 7,042,752 B2 | 5/2006 | Okuda | |
| 7,049,667 B2 | 5/2006 | Chow et al. | |
| 7,170,317 B2 * | 1/2007 | White | 326/53 |
| 7,279,936 B2 * | 10/2007 | Gliese et al. | 326/104 |
| 7,328,419 B2 | 2/2008 | Vuong et al. | |
| 7,383,521 B2 | 6/2008 | Smith et al. | |
| 7,844,936 B2 | 11/2010 | Melzner | |
| 7,895,548 B2 | 2/2011 | Lin et al. | |
| 2002/0096744 A1 | 7/2002 | Chow et al. | |
| 2002/0096776 A1 | 7/2002 | Chow et al. | |
| 2004/0061186 A1 | 4/2004 | Chow et al. | |
| 2004/0130349 A1 * | 7/2004 | Morgenshtein et al. | 326/112 |
| 2004/0144998 A1 | 7/2004 | Chow et al. | |
| 2005/0140389 A1 * | 6/2005 | Gliese et al. | 326/41 |
| 2005/0161748 A1 | 7/2005 | Chow et al. | |
| 2005/0230787 A1 | 10/2005 | Chow et al. | |
| 2007/0261015 A1 * | 11/2007 | Morgenshtein et al. | 716/18 |
| 2008/0237644 A1 | 10/2008 | Tripathi | |
| 2008/0282208 A1 | 11/2008 | Anderson et al. | |
| 2010/0218158 A1 | 8/2010 | Chow et al. | |
| 2010/0231263 A1 * | 9/2010 | Fish et al. | 326/121 |

* cited by examiner

Logic symbol of $Z = A \bullet \overline{B}$

Logic symbol of $Z = B \bullet C$

Logic symbol of $Z = \overline{B} + C$

Logic Programming of basic logic block with camouflage

Camouflage Connectors in Silicon programmed with LDD
Implants

Prior Art

Programming of logic block to become Inverter and Buffer

Programming of logic block to be a latch

Master Slave D Flip Flop implemented in two registers

Example of the new basic building block generates more logic combinations

US 8,111,089 B2

BUILDING BLOCK FOR A SECURE CMOS LOGIC CELL LIBRARY

CROSS-REFERENCE TO RELATED APPLICATIONS

This application claims benefit of U.S. Provisional Patent Application Ser. No. 61/181,930, entitled "BUILDING BLOCK FOR A SECURE CMOS LOGIC CELL LIBRARY," filed May 28, 2009, by Ronald P. Cocchi, James P. Baukus, Bryan J. Wang, Lap Wai Chow, and Paul Ouyang, which application is hereby incorporated by reference herein.

This application is also related to U.S. patent application Ser. No. 12/578,441, entitled "METHOD AND APPARATUS FOR CAMOUFLAGING A STANDARD CELL BASED INTEGRATED CIRCUIT," by Lap Wai Chow, James P. Baukus, Bryan J. Wang, and Ronald P. Cocchi, filed Nov. 10, 2009, which is a continuation-in-part of U.S. patent application Ser. No. 12/380,094, filed Feb. 24, 2009 and entitled "METHOD AND APPARATUS FOR CAMOUFLAGING A PRINTED CIRCUIT BOARD," by Lap Wai Chow, James P. Baukus, Bryan J. Wang, and Ronald P. Cocchi, which applications are incorporated by reference herein.

BACKGROUND OF THE INVENTION

1. Field of the Invention

The present invention relates to systems and methods for protecting integrated circuits from reverse engineering and in particular to a building block for a logic cell library that is strongly resistant to reverse engineering.

2. Description of the Related Art

In a conventional CMOS cell library, every logic cell has a unique way of interconnecting its devices (its schematic) which is well known to technical personnel familiar with CMOS circuit design. For example, a NAND gate has the P-channel devices connected in parallel and the N-channel devices connected in series, and a NOR gate has P-channel devices connected in series and N-channel devices connected in parallel.

An exemplary schematic of a standard 2-input NAND gate and a 2-input NOR gate, includes P devices 10 and N devices 11, are shown in FIG. 1. Reverse engineers can use this valuable information to identify the function of each logic gate and thus are able to extract the complete ASIC design. What is needed is a method and apparatus for making reverse engineering of circuits more difficult. The present invention satisfies that need by presenting a circuit block that can be used for a wide variety of logical functions. One attempting to reverse engineer an ASIC designed with logic gates as described herein faces a large number of identical circuit blocks and will not be able to find any obvious clue for logic function identification.

SUMMARY OF THE INVENTION

A logical circuit is described. In one embodiment, the logical circuit comprises a first logic input, a second logic input, a control input for implementing a plurality of logical functions, and a logic output, wherein the logic circuit is configured to implement a plurality of logical functions according to the control input, where the state of the control input is controlled by camouflaged circuitry.

A new method of using basic building blocks to design a logic cell library for CMOS (Complementary Metal Oxide Silicon) ASICs (Application Specific Integrated Circuits) is discussed. Different logic gates, built with the same building block as described in this invention, will have the same schematics of transistor connection and also the same physical layout so that they appear to be physically identical under optical or electron microscopy. An ASIC designed from a library of such logic cells is strongly resistant to a reverse engineering attempt.

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Figure 1:
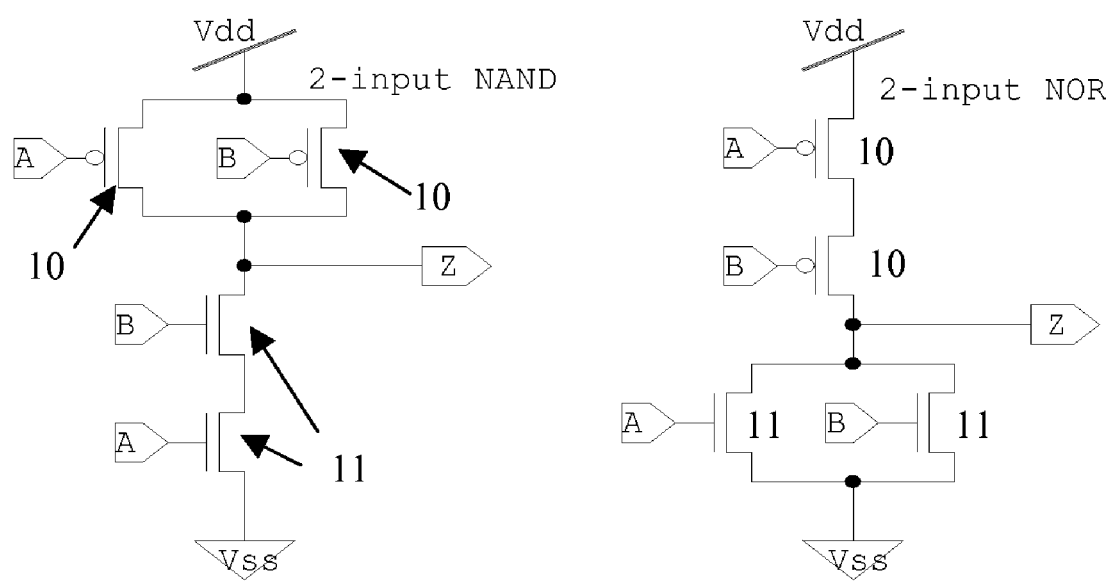
FIG. 1 are schematics of 2-input NAND gate and 2-input NOR gate.

The schematics of a standard 2-input NAND gate and a 2-input NOR gate are shown in FIG. 1 where 10 refers to P devices and 11 refers to N devices. Reverse engineers can use this valuable information to identify the function of each logic gate and thus are able to extract the complete ASIC design. Reverse engineering of an ASIC designed with logic gates implemented by the method of this invention will face a large number of identical circuit blocks and will not be able to find any obvious clue for logic function identification.

Figure 2:
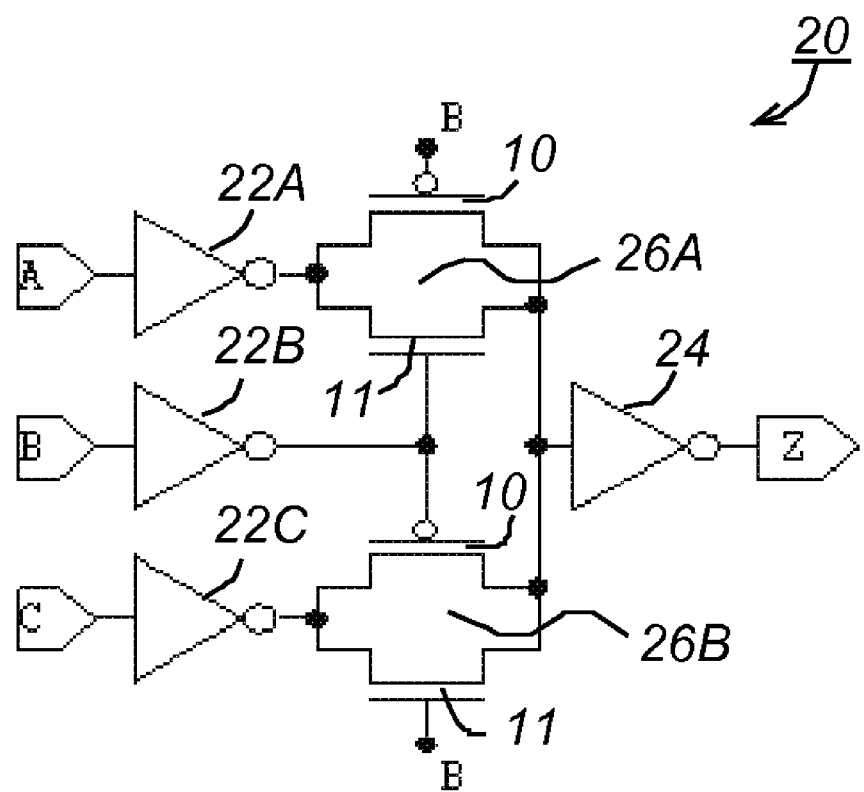
FIG. 2 is a diagram presenting an exemplary schematic of the new logic building block.

FIG. 2 shows the schematic of one embodiment the basic logic building block 20, which has three inputs A, B and C and one output Z. The circuit 20 consists of three input inverters (22A, 22B, and 22C), two transmission gates 26A, 26B and an output buffering inverter (24). A transmission gate 26A or 26B are built with a P-channel device 10 connected with its source and drain terminals in parallel with the source and drain of an N-channel device 11. Transmission gates 26A or 26B basically work as an on/off switch when the appropriate voltages are applied to the gates of both P-channel 10 and N-channel 11 devices. In complimentary metal oxide semiconductor logic (CMOS) circuits, a P-channel device 10 is be turned on by a low voltage (Vss) at the gate B, and turned off by a high voltage (Vdd) at the gate B. The N-channel device 11 is 'on' with a high gate voltage (Vdd), and 'off' with a low gate voltage (Vss).

The circuit in FIG. 2 operates as follows. Input B controls the turn-on and turn-off of the transmission gate 26A or 26B. When B is at low voltage (Vss), which is equivalent to logic '0', the top transmission gate 26A is turned on and the bottom transmission gate 26B is turned off. The input of the output buffer inverter 24 will receive signal from the output of the inverter with input A. Thus, output Z will be equal to input A. If input B is at high voltage (Vdd) as logic '1', the top transmission gate 26A will be off and the bottom transmission gate 26B will be on. The input of output buffer inverter 24 will receive signal from the output of the inverter at C (22C) and output Z will be equal to input C. This is basically a multiplexer circuit with input B controlling the path of input A or input C to output Z.

However, if one of the inputs A, B or C has a fixed logic value, this circuit 20 will have a different logical function, depending on this fixed logic value and will result in a variety of different logic relations between the output and the inputs. In other words, the circuit in FIG. 2 performs a logic operation of inputs A and B depending on the logic state of input C. It is also true that the logic operation of inputs B and C depends on the logic state of input A.

When input C has a logic state of '1' (at Vdd supply voltage), the circuit is analyzed for its input to output logic relationship and the result is stated in the truth table of Table 1.

TABLE 1

Truth Table Inputs A and B when C = "1"
$Z = A + B$

| A | B | Z |
|---|---|---|
| 0 | 0 | 0 |
| 1 | 0 | 1 |
| 0 | 1 | 1 |
| 1 | 1 | 1 |

Figure 3:
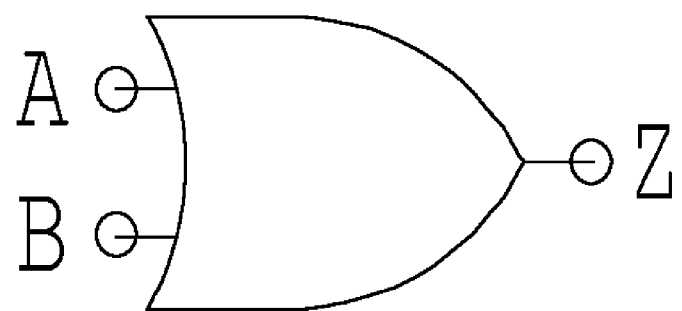
FIG. 3 is a diagram presenting an exemplary logic symbol of Z=A+B.
Figure 4:
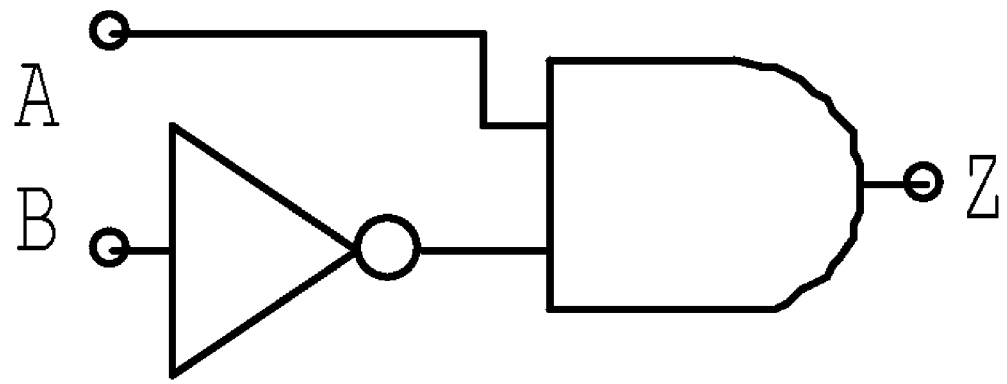
FIG. 4 is a diagram presenting an exemplary logic symbol of Z=A·$\overline{B}$.

It can be found from Table 1 that the output Z is the logical function 'OR' of inputs A and B. In logic equation form, this is specified as $Z=A+B$. A logic symbol representation of $Z=A+B$ is also drawn in FIG. 3. When the logic state at input C is '0' (at Vss voltage), the logic relationship of output Z on inputs A and B becomes 'A AND B bar'. In logic equation form, it is specified as $Z=A\cdot \overline{B}$, where $\overline{B}$ is the logical inverse of input B. This logic relationship is illustrated in the truth table of Table 2 and its associated logic symbol is drawn in FIG. 4.

TABLE 2

Truth Table Inputs A and B when C = "0"
$Z = A \cdot \overline{B}$

| A | B | Z |
|---|---|---|
| 0 | 0 | 0 |
| 1 | 0 | 1 |
| 0 | 1 | 0 |
| 1 | 1 | 0 |

The same analogy can be applied to having input A as the controlling logic state and the circuit performs logic operation on input B and input C. When input A has a logic state of '0' (at Vss voltage), from Table 3 the output Z is the logical function 'AND' of inputs B and C.

TABLE 3

Truth Table Inputs B and C when A = "0"
$Z = B \cdot C$

| B | C | Z |
|---|---|---|
| 0 | 0 | 0 |
| 1 | 0 | 0 |
| 0 | 1 | 0 |
| 1 | 1 | 1 |

Figure 5:
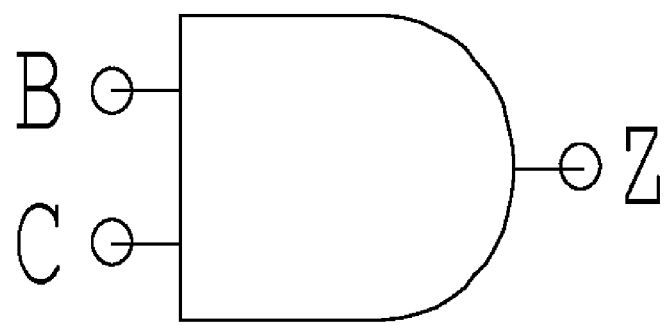
FIG. 5 is a diagram presenting an exemplary logic symbol of Z=B·C.
Figure 6:
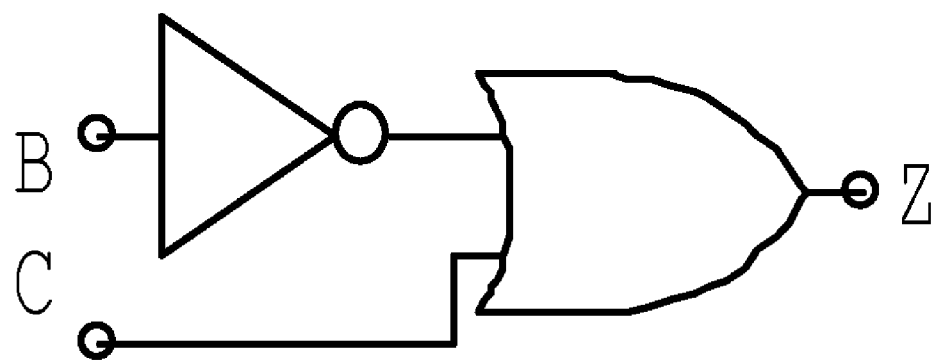
FIG. 6 is a diagram presenting an exemplary logic symbol of Z=$\overline{B}$+C.

In logic equation form, this is specified as $Z=B\cdot C$. A logic symbol representation of $Z=B\cdot C$ is drawn in FIG. 5. Again, when the logic state at input A is '1' (at Vdd supply voltage), the logic relationship of output Z on inputs B and C becomes 'B bar OR C', or in logic equation form, specified as $Z=\overline{B}+C$ where $\overline{B}$ is the logical inverse of input B. This logic relationship and logic symbol are illustrated in Table 4 and FIG. 6 respectively.

TABLE 4

Truth Table Inputs B and C when A = "1"
$Z = \overline{B} + C$

| B | C | Z |
|---|---|---|
| 0 | 0 | 1 |
| 1 | 0 | 0 |
| 0 | 1 | 1 |
| 1 | 1 | 1 |

Since the actual logic function performed by the circuit in FIG. 2 can be varied by the logic states of either inputs A or C, which is to say that the circuit in FIG. 2 can be a different logic gate (either an AND gate or OR gate) depending on the logic content at either of its inputs. Further, while the embodiment shown in FIG. 2 comprises two inputs and a control input, using the principles described above, building blocks can be constructed that include additional inputs and/or outputs as desired.

Figure 7:
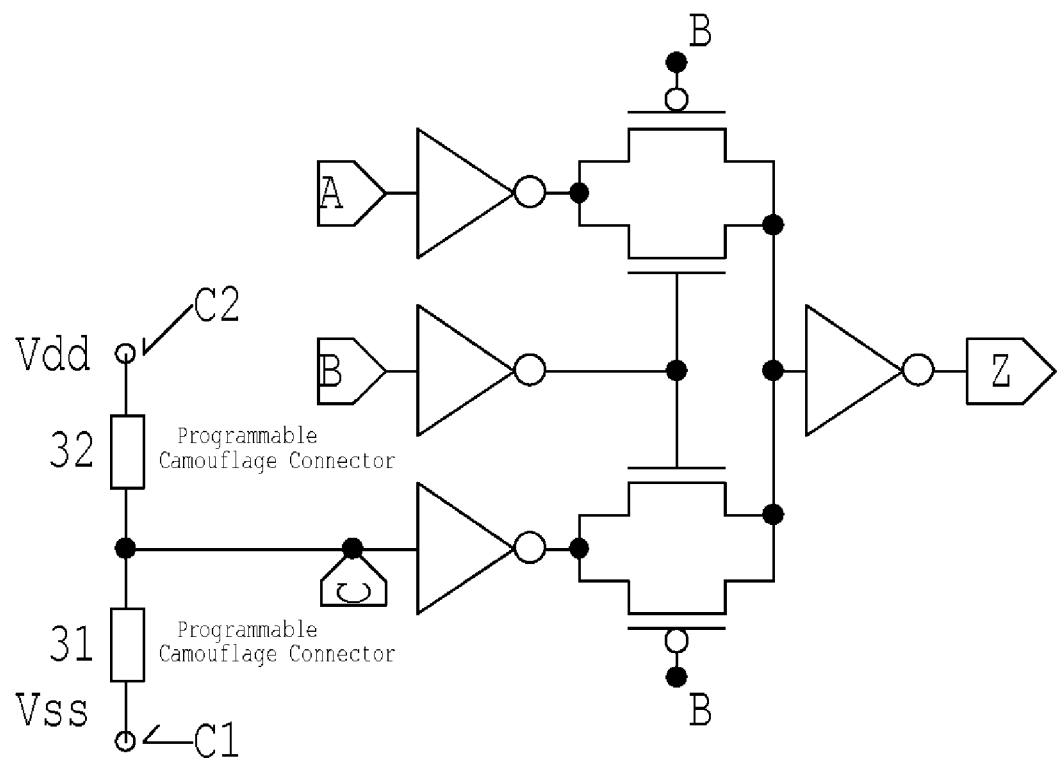
FIG. 7 is a diagram presenting exemplary logic programming of basic logic block with camouflage connectors.

FIG. 7 illustrates an example of how this bit content can be programmed to change the logic function of the basic logic block of FIG. 2. Two camouflage connectors 31, 32 are used in FIG. 7 connecting to the input C of the basic logic block 20. A camouflage connector 31, 32 is a structure in CMOS technology that can be programmed to be either a connection or isolation but is very difficult to detect by reverse engineering. Different ways of building camouflage connectors are disclosed in U.S. Patent Publication US20080079082, and U.S. Pat. No. 7,166,515, U.S. Pat. No. 7,049,667, U.S. Pat. No. 6,897,535, U.S. Pat. No. 6,117,762, each of which are hereby incorporated by reference herein. The fundamental principle in all these patents is to make a structure in CMOS technology that can be either a connection or isolation, and without any obvious imaging difference between the connection and isolation of such a structure when exposed to a reverse engineering attack.

In FIG. 7, one camouflage connector 31 connects input C to the node labeled as C1, the other camouflage connector 32 is connected between input C and node labeled as C2. Nodes C1 and C2 can be driven by supply voltages Vdd, Vss, or by other active output signals from other logic cells, or even by the logic block's own output Z as a feedback signal. When the top camouflage connector 32 is programmed to be a connection with node C2 connected to Vdd, while the bottom camouflage connector 31 is programmed to be in isolation, input C will receive a logic state of '1' and the logic block performs as an 'OR' gate of inputs A and B. Node C1 in this case can be connected to any signal since the bottom camouflage connector 31 is isolated.

If the top camouflage connector (32) is programmed to be isolated, while the bottom camouflage connector 31 is programmed to be a connector with node C1 connected to Vss, the logic state at input C is '0' and the logic block performs the logic function of 'A AND B bar' ($Z=A \cdot \overline{B}$). Node C2 in this case can be connected to any signal since the top camouflage connector is isolated.

Figure 8:
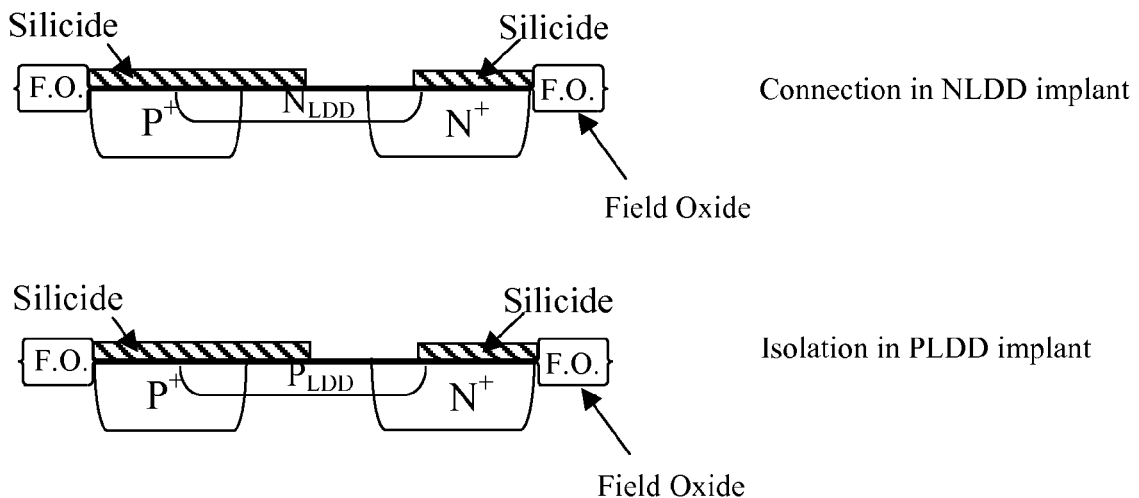
FIG. 8 is a diagram presenting exemplary camouflage connectors in silicon programmed with LDD implants.

An example from U.S. Patent Publication 20080079082 is shown in FIG. 8. The top drawing in FIG. 8 shows a connection implemented with an N-type extension implant, also called an NLDD (N-type Lightly Doped Drain) implant. To make such a camouflage connector, a silicide window is opened over a PN junction in an active silicon area to avoid a direct short of the PN junction through Silicide. Silicide, sometimes called Salicide (Self-aligned Silicide), is a metallic silicon compound formed by depositing a thin layer of metal (e.g. Titanium) on the silicon surface for the purpose of reducing the sheet resistance of the silicon implanted regions. When the center part of this PN junction with silicide window is implanted with NLDD implant, the two terminals of the PN junction will be shorted, due to the conduction path from N+ region to NLDD region and further from NLDD region to P+ region via the silicide on top. The NLDD implant is one of the standard implants in the CMOS fabrication process. It is a lighter doped implant compared to the source and drain N+/P+ implants. Its function is to reduce the short channel effect of the CMOS N-type devices. The P-type extension, or PLDD implant, is the similar kind of implant for the P-type device in CMOS fabrication. Switching the NLDD in the top structure of FIG. 8 to PLDD implant will turn the structure into isolation as a reverse biased PN junction. This is shown in the bottom drawing of FIG. 8. The presence of field oxide (F.O.) is to isolate the camouflage connectors from other active circuits. Since NLDD and PLDD implants are lighter in concentration and shallower in depth compared to the source and drain N+/P+ implants, reverse engineers will find them difficult to differentiate when they are located next to the heavy doped N+/P+ region. It is favorable to use as many as possible of the different techniques to implement camouflage connectors, because the greater the variety of camouflage connectors, the more difficult it will be to reverse engineer an ASIC designed with these camouflage connectors.

Logic cells of different functions can be built by combining the basic logic building block 20 of FIG. 2 together with variety of camouflage connector structures (including the one shown in FIG. 8). A secure CMOS library described in this invention is a collection of such logic cells. Groups of various logic cells in the secure CMOS library are designed with the same building block (such as is shown in FIG. 2) so they have identical circuits and physical layout. An ASIC, designed with this secure library will have a large number of identical logic building blocks with identical physical appearance. This prevents reverse engineers from relying on the appearance of the logic gates to identify their logic functions.

A secure CMOS logic cell library requires various logic elements. In general, these elements can be categorized into random logic gates including but not limited to AND gates, OR gates, inverters and buffers, and sequential logic elements of latches and flip-flops. For random logic gates, De Morgan's law can be used to synthesize any random logic function with a minimum set of logic gates of 2-input AND gates, 2-input OR gates and inverters. For sequential logic cells, the fundamental elements are one-bit latches and D-type flip-flops.

A minimum logic library can have minimum logic gates of a 2-input AND, a 2-input OR, an inverter and also a 1-bit latch and a D-type flip flop. Although not necessarily efficient, theoretically this minimum library can generate any logic combination.

In order to have a more efficient and optimized logic implementation, a logic library with more cells should be used. The basic logical building block 20 can be used to implement other logic elements as follows. We have already described in the above text how a 2-input AND gate and a 2-input OR gate can be implemented using the basic logic block circuit 20. Since inverting capability may be needed in a logic cell library, it can be noted that in the realization of logic gates depicted in FIG. 4 and FIG. 6, input B is inverted before going through logic operation with input A or input C. Therefore, the basic logic block circuit 20 includes inverting capability.

Figure 9:
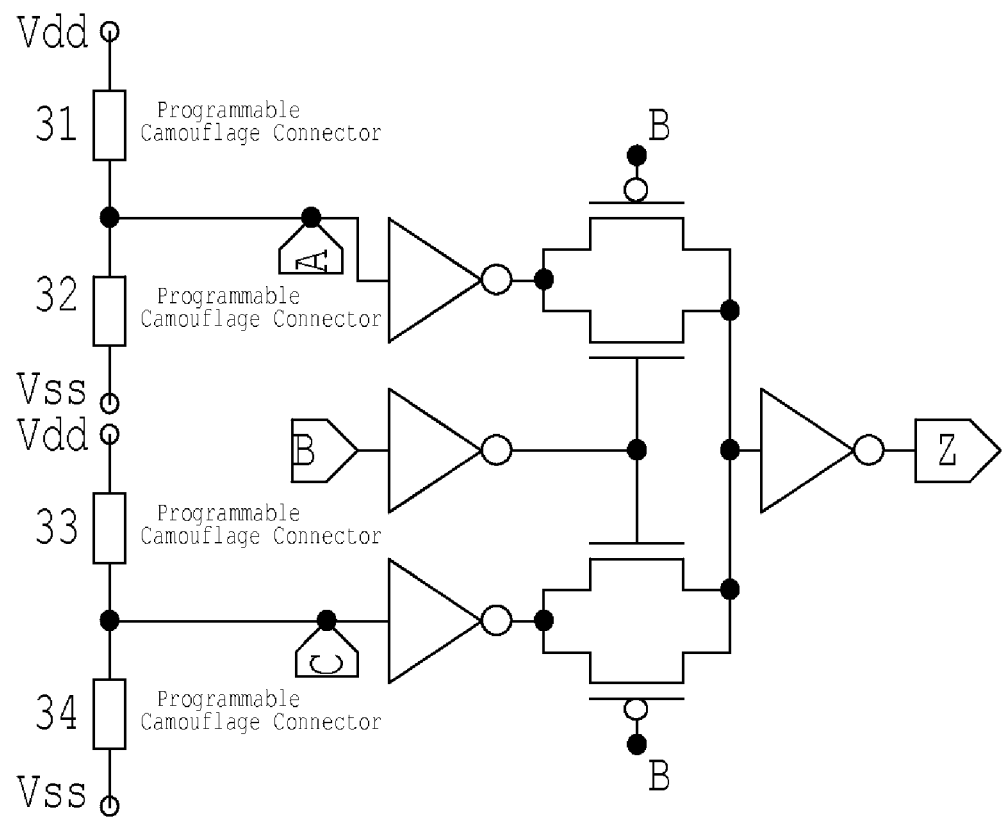
FIG. 9 is a diagram presenting an exemplary programming of logic block to become inverter and buffer.

An individual inverter can also be implemented with the same building block in FIG. 2. FIG. 9 shows how an inverter of input B can be accomplished. When input A is at logic '0' (voltage at Vss) and input C is at logic '1' (voltage at Vdd), the circuit in FIG. 9 works as an inverter of input B. The same circuit in FIG. 9 with input A at logic '1' (Vdd voltage) and input C at logic '0' (Vss voltage) will become a non inverting buffer of input B. Multiple camouflage connectors are used here in the programming of logic states at input A and input C. Camouflage connectors 31, 32, 33 and 34 can be independently programmed as 'on' (conduction) or 'off' (isolation) to give the necessary logic states of '1' or '0' to input A and input C making the circuit an inverter or a non inverting buffer.

Figure 10:
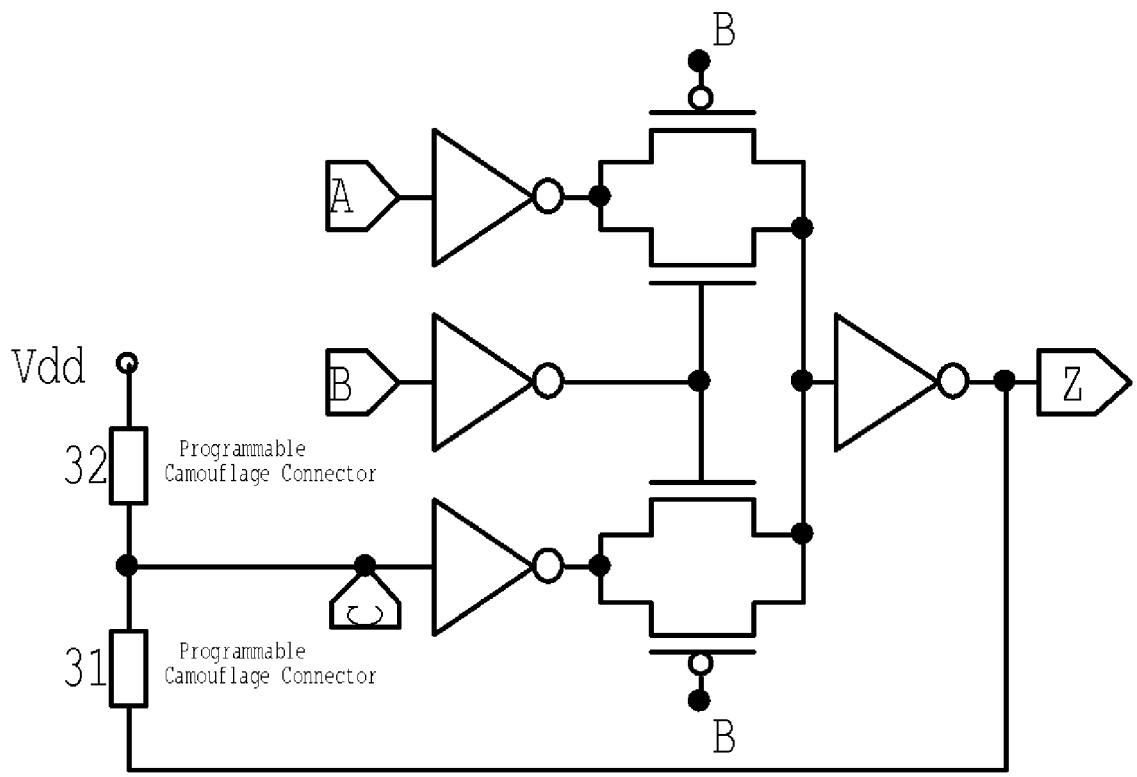
FIG. 10 is a diagram presenting an exemplary programming of logic block to be a T-latch.

For sequential logic, a latch can also be made with the basic building block in FIG. 2 together with a camouflage connector connecting input C to the output Z. This is depicted in FIG. 10. When camouflage connector 31 in FIG. 10 is programmed to be 'on' (conduction) while camouflage connector 32 is 'off' (isolation), the circuit is a latch with input at A and output at Z. Input B is the latch clock of this circuit. If the programming of the camouflage connectors 31 and 32 is reversed with 31 being 'off' and 32 being 'on', the circuit in FIG. 10 is the same as FIG. 3 which is an OR gate of input A and B. Although circuit in FIG. 10 has a unique connection from the output Z to the camouflage connector 31, reverse engineering can not rely on that information to assume its specific logic function because its actual logic function is still determined by the on and off of the camouflage connectors. This is a critical consideration when applying the teaching of this description to design logic library cells. The goal is to maintain enough possibilities of uncertainty for every logic cell design so no single cell has any unique signature for recognition in a reverse engineering attempt.

Figure 11:
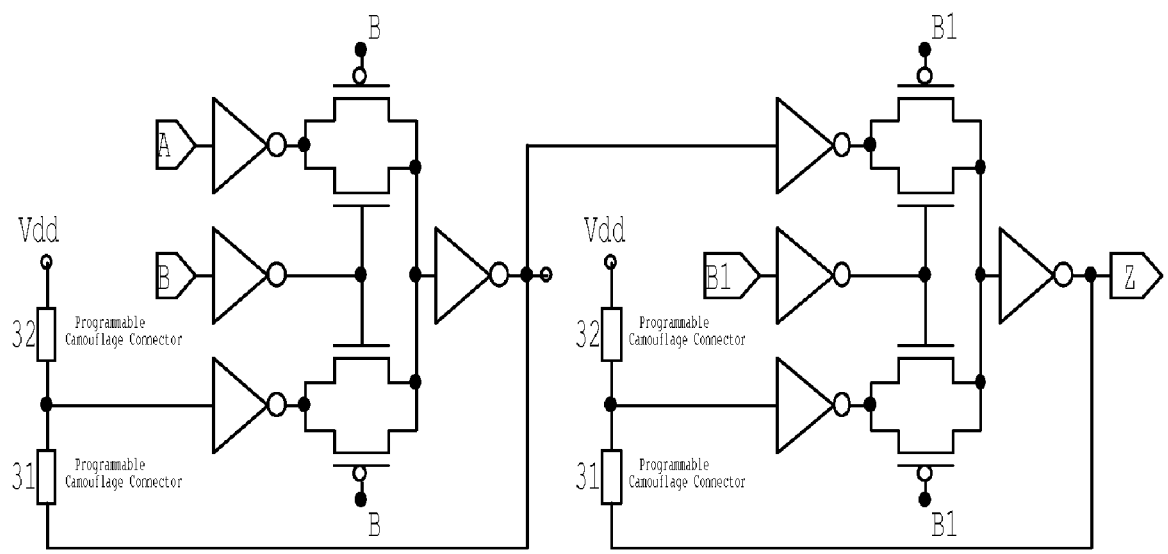
FIG. 11 presents an exemplary Master Slave D Flip Flop implemented in two latches A=D input, Z=Q output, B=Clock bar, and B1=Clock.

A master and slave D-type Flip-flop can be realized by two of the above latches connected in series. FIG. 11 is the diagram for such a D-type Flip flop with input A being the D input of the flip-flop and output Z being the output Q of the flip-flop. Input B1 and input B will be equivalent to the Clock and the Clock bar of the flip flop respectively. Both camouflage connectors 31 in FIG. 11 are in conduction and both camouflage connectors 32 are in isolation. This invention is not limited to the implementation of the above described logic cells. Other logic functions like the Multiplexer, Exclusive OR, Adders, etc. can also be implemented in a similar fashion with the basic building block of this invention.

Figure 12:
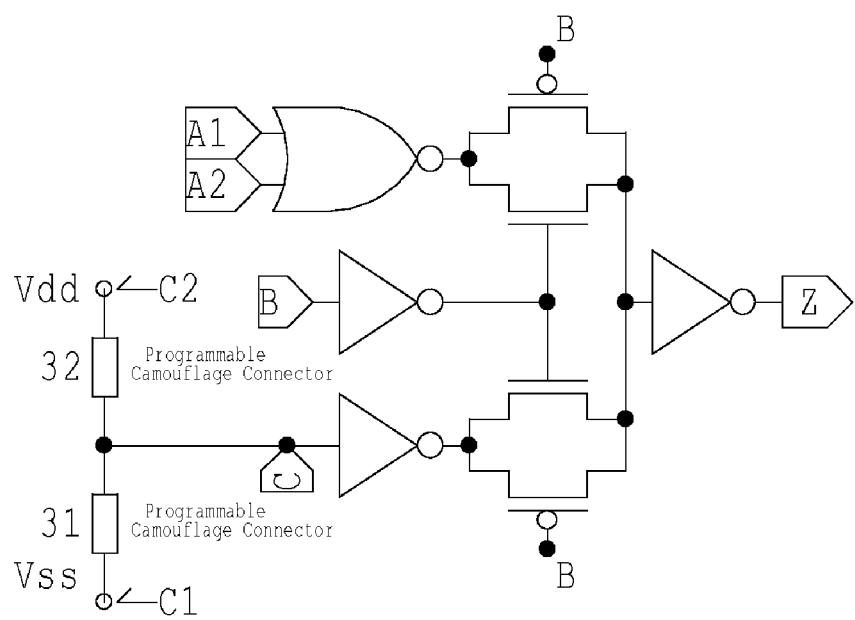
FIG. 12 is a diagram presenting an exemplary basic building block which generates more logic combinations where Z=(A1+A2+B)

With some minor modifications of the basic building block, for example inverters at inputs A, B, C and output Z are replaced with logic gates, more combinations of logic functions can be further realized. FIG. 12 demonstrates the example of a new logic functional block when the inverter at input A is replaced with a NOR gate. Although the circuit of the building block in FIG. 12 is different from the original basic building block in FIG. 2, its actual logic function is still determined by the logic state of input C. It can be derived by analyzing the circuit when input C is at logic '0', the logic function of output Z equals to A1+A2+B. When input C is at logic '1', the logic function of output Z equals to Z=(A1+A2)· B. Similarly, logic gates of other functions can replace the other input inverters or the output inverter to create different building blocks for more complex logic functions.

A practical secure logic cell library implemented by this invention can have more than one basic building block to optimize the effectiveness of logic synthesizing in a real ASIC design. A practical library may also have cells of the same logic function but different driving capabilities due to the requirement of different loading conditions in the real ASIC design. In this invention, different driving capabilities can be achieved by modifying the basic building block with different sizes of the inverter at output Z 24 (FIG. 2).

In the practice of a modern ASIC design, the whole ASIC logic function is written in high-level hardware description language like the VHDL or VERILOG. It will be simulated and verified with a VHDL/VERILOG logic simulator. The final ASIC design which is still in VHDL or VERILOG language will be read into a logic synthesizer (e.g. SYNOPSYS DESIGN COMPILER) to synthesize the logic implementation and generate a connection netlist (schematics) of logic cells based on a target logic cell library. It is not necessary and not possible for a library to have logic cells of all possible logic functions, instead De Morgan's law will be extensively used in the logic-synthesizing step to map the design to the available functions. It was mentioned earlier that a minimum logic library can have only one 2-input AND gate, one 2-input OR gate, one Inverter, one single bit latch and a D-type flip flop. A logic synthesizer can even use such a library with the minimum number of logic elements to create a netlist of a real ASIC design. In reality, it will be more effective and efficient meeting the operational speed and silicon area requirements of the ASIC for a logic library to have more logic functional cells. A practical library usually contains several hundred of cells with multiple drive capabilities. A real logic cell library may only have 20-50 different types of logic functions.

An ASIC designed with a logic library developed with techniques described in this invention will contain hundred of thousands or even millions of a few slightly different basic building blocks with also millions of all sorts of camouflage connectors. There is no obvious signature of any kind to give any clue of each logic cell's actual function. Reverse engineering can not rely on simple optical or electron microscope images to extract the actual ASIC design. While it is true that the connection or isolation of a camouflage connector can still be identified by direct manual probing, there has not yet been an automatic and speedy direct probing mechanism that can produce accurate probing results for millions of microscopic camouflage connectors within a reasonable amount of time. Direct probing of every camouflage connector in an ASIC designed with a library from this invention is impractical. Such an ASIC can strongly resist a reverse engineering attack.

Figure 13:
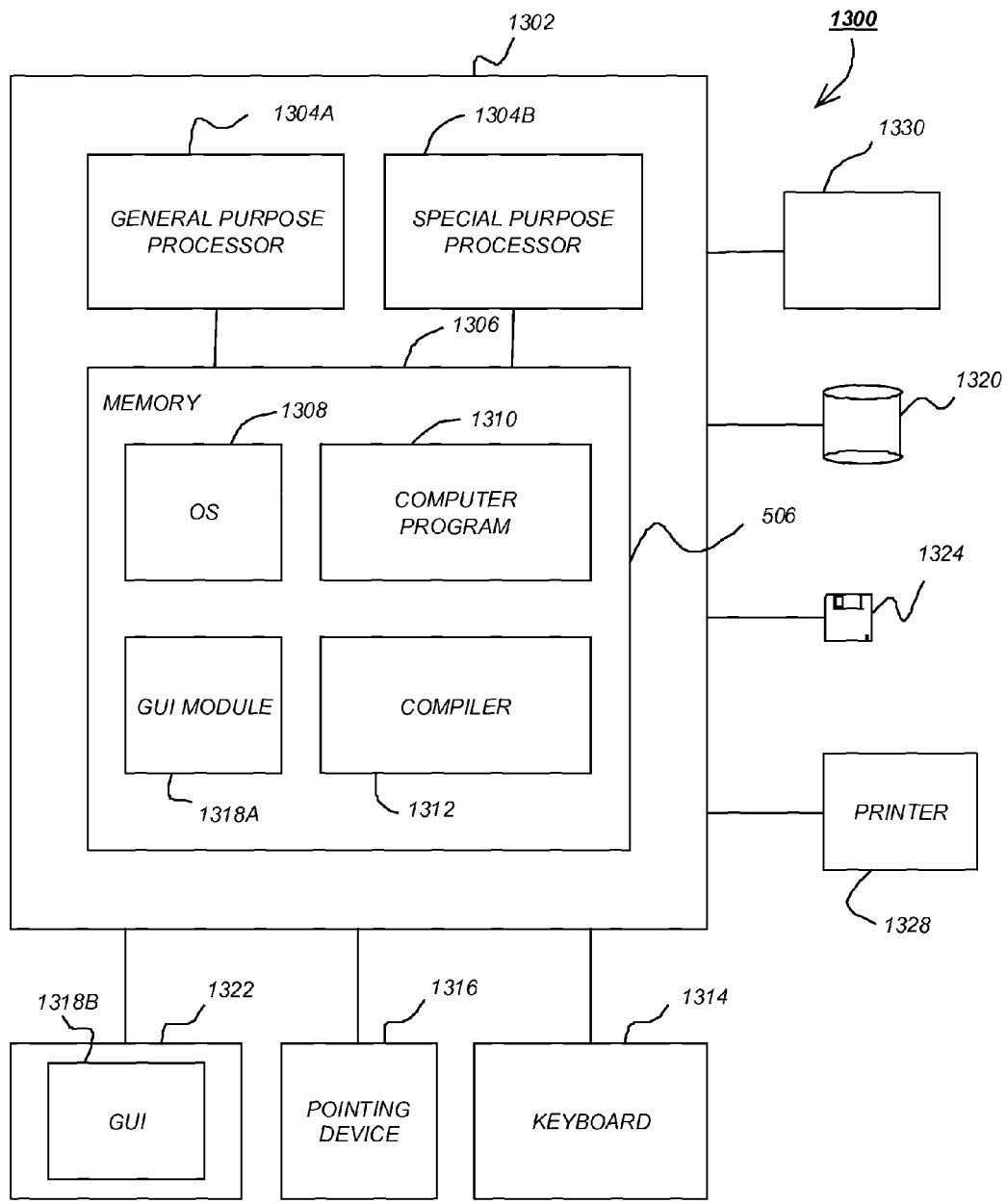
FIG. 13 is a diagram illustrating an exemplary computer system that can be used to implement embodiments of the invention.

FIG. 13 is a diagram illustrating an exemplary computer system 100 that could be used to implement elements of the present invention. The computer 1302 comprises a general purpose hardware processor 1304A and/or a special purpose hardware processor 1304B (hereinafter alternatively collectively referred to as processor 1304) and a memory 1306, such as random access memory (RAM). The computer 1302 may be coupled to other devices, including input/output (I/O) devices such as a keyboard 1314, a mouse device 1316 and a printer 1328.

In one embodiment, the computer 1302 operates by the general-purpose processor 1304A performing instructions defined by the computer program 1310 under control of an operating system 1308. The computer program 1310 and/or the operating system 1308 may be stored in the memory 1306 and may interface with the user and/or other devices to accept input and commands and, based on such input and commands and the instructions defined by the computer program 1310 and operating system 1308 to provide output and results.

Output/results may be presented on the display 1322 or provided to another device for presentation or further processing or action. In one embodiment, the display 1322 comprises a liquid crystal display (LCD) having a plurality of separately addressable pixels formed by liquid crystals. Each pixel of the display 1322 changes to an opaque or translucent state to form a part of the image on the display in response to the data or information generated by the processor 1304 from the application of the instructions of the computer program 1310 and/or operating system 1308 to the input and commands. Other display 1322 types also include picture elements that change state in order to create the image presented on the display 1322. The image may be provided through a graphical user interface (GUI) module 1318A. Although the GUI module 1318A is depicted as a separate module, the instructions performing the GUI functions can be resident or distributed in the operating system 1308, the computer program 1310, or implemented with special purpose memory and processors.

Some or all of the operations performed by the computer 1302 according to the computer program 1310 instructions may be implemented in a special purpose processor 1304B. In this embodiment, some or all of the computer program 1310 instructions may be implemented via firmware instructions stored in a read only memory (ROM), a programmable read only memory (PROM) or flash memory within the special purpose processor 1304B or in memory 1306. The special purpose processor 1304B may also be hardwired through circuit design to perform some or all of the operations to implement the present invention. Further, the special purpose processor 1304B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 1302 may also implement a compiler 1312 which allows an application program 1310 written in a programming language such as COBOL, C++, FORTRAN, or other language to be translated into processor 1304 readable code. After completion, the application or computer program 1310 accesses and manipulates data accepted from I/O devices and stored in the memory 1306 of the computer 1302 using the relationships and logic that was generated using the compiler 1312.

The computer 1302 also optionally comprises an external communication device such as a modem, satellite link, Ethernet card, or other device for accepting input from and providing output to other computers.

In one embodiment, instructions implementing the operating system 1308, the computer program 1310, and/or the compiler 1312 are tangibly embodied in a computer-readable medium, e.g., data storage device 1320, which could include one or more fixed or removable data storage devices, such as a zip drive, floppy disc drive 1324, hard drive, CD-ROM drive, tape drive, or a flash drive. Further, the operating system 1308 and the computer program 1310 are comprised of computer program instructions which, when accessed, read and executed by the computer 1302, causes the computer 1302 to perform the steps necessary to implement and/or use the present invention or to load the program of instructions into a memory, thus creating a special purpose data structure causing the computer to operate as a specially programmed computer executing the method steps described herein. Computer program 1310 and/or operating instructions may also be tangibly embodied in memory 1306 and/or data communications devices 1330, thereby making a computer program product or article of manufacture according to the invention. As such, the terms "article of manufacture," "program storage device" and "computer program product" or "computer readable storage device" as used herein are intended to encompass a computer program accessible from any computer readable device or media.

Of course, those skilled in the art will recognize that any combination of the above components, or any number of different components, peripherals, and other devices, may be used with the computer 1302.

Although the term "computer" is referred to herein, it is understood that the computer may include portable devices such as cellphones, portable MP3 players, video game consoles, notebook computers, pocket computers, or any other device with suitable processing, communication, and input/output capability.

CONCLUSION

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A building block logic circuit, comprising:
   a first input;
   a second input;
   a third input; and
   a logic output, communicatively coupled to the first input and the second input and the third input;
   wherein any one of the first input, the second input and the third input is configurable as a control input for selecting a logical function of the logical circuit and the remaining of the first input, the second input and the third input as logic inputs and the control input is communicatively coupled to a camouflage connector.

2. The logic circuit of claim 1, comprising:
   a first inverter having a first inverter input coupled to the first input and a first inverter output;
   a second inverter having a second inverter input coupled to the second input and a second inverter output;
   a third inverter, having a third inverter input coupled to the third input and a third inverter output;
   a fourth inverter having a fourth inverter input and an fourth inverter output representing the logic output;
   a first device having:
      a first device input coupled to the first inverter output;
      a first device gate coupled to the second input;
      a first device output coupled to the fourth inverter input;
   a second device, having:
      a second device input coupled to the first inverter output;
      a second device gate coupled to the third inverter output;
      a second device output coupled to the fourth inverter input;
   a third device, having:
      a third device input coupled to the second inverter output;
      a third device gate coupled to the third inverter output;
      a third device output coupled to the fourth inverter input;
   a fourth device, having:
      a fourth device input coupled to the second inverter output;
      a fourth device gate coupled to the control input;
      a fourth device output coupled to the fourth inverter input.

3. The logic circuit of claim 2, wherein:
   the first device is a P-channel device;
   the second device is an N-channel device;
   the third device is an P-channel device; and
   the fourth device is a N-channel device.

4. The logic circuit of claim 3, wherein the first device, the second device, the third device, and the fourth device are field effect transistors.

5. The logic circuit of claim 1, wherein:
   the first input has a logical state of A and the second input has a logical state of B; and
   the selectable logic function of the logic circuit is A+B when the third input is a first logical value and is A·$\overline{B}$ when the third input is a second logical value.

6. The logic circuit of claim 1, wherein:
   the third input has a logical state of C and the second input has a logical state of B; and
   the selectable logic function of the logic circuit is B·C when the first input is a first logical value and $\overline{B}$+C when the first input is a second logical value.

7. The logic circuit of claim 1, wherein the control input is programmed.

8. The logic circuit of claim 7, wherein the control input is programmed using a camouflaged circuit.

9. The logic circuit of claim 1, wherein:
   the logic output has a logical state being a selectable one of a plurality of logical functions of the remaining of the first input, second input and third inputs, the selectable one of the plurality of logical functions determined at least in part according to which of the first input, the second input, and the third input is configured as the control input.

10. A logic circuit, comprising:
    a plurality of interconnected logical building block circuits, each building block circuit having an identical circuit layout and each building block circuit comprising:
       a first input;
       a second input;
       a third input; and
       a logic output, communicatively coupled to the first input and the second input and the third input;
       wherein any one of the first input, the second input and the third input is configurable as a control input for selecting a logical function of the logical circuit and the remaining of the first input, the second input, and the third input as logic inputs.

11. The logic circuit of claim 10, wherein:
the control input is communicatively coupled to a camouflage connector.

12. The logic circuit of claim 10, wherein each of the logical building block circuits comprises:
- a first inverter having a first inverter input coupled to the first input and a first inverter output;
- a second inverter having a second inverter input coupled to the second input and a second inverter output;
- a third inverter, having a third inverter input coupled to the third input and a third inverter output;
- a fourth inverter having a fourth inverter input and an fourth inverter output representing the logic output;
- a first device having:
  - a first device input coupled to the first inverter output;
  - a first device gate coupled to the control input;
  - a first device output coupled to the fourth inverter input;
- a second device, having:
  - a second device input coupled to the first inverter output;
  - a second device gate coupled to the third inverter output;
  - a second device output coupled to the fourth inverter input;
- a third device, having:
  - a third device input coupled to the second inverter output;
  - a third device gate coupled to the third inverter output;
  - a third device output coupled to the fourth inverter input;
- a fourth device, having:
  - a fourth device input coupled to the second inverter output;
  - a fourth device gate coupled to the control input;
  - a fourth device output coupled to the fourth inverter input.

13. The logic circuit of claim 12, wherein:
each of the first devices are P-channel devices;
each of the second devices are N-channel devices;
each of the third devices are P-channel devices; and
each of the fourth devices are N-channel devices.

14. The logic circuit of claim 13, wherein each of the first devices, the second devices, the third devices, and the fourth devices are field effect transistors.

15. The logic circuit of claim 10, wherein:
the selectable logic function of at least one of the logical building block circuits is A+B when the control input is a first logical value and is $A \cdot \overline{B}$ when the building block's control input is a second logical value, wherein the first input of the at least one of the logical building block circuits has a logical state of A and the second input of the at least one of the selectable building block circuits has a logical state of B.

16. The logic circuit of claim 10, wherein:
the selectable logic function of at least one of the logical building block circuits is $B \cdot C$ when the first input is a first logical value and $\overline{B}+C$ when the first input is a second logical value, wherein the second input of the at least one of the logical building block circuits has a logical state of B and the third input of the at least one of the selectable building block circuits has a logical state of C.

17. The logic circuit of claim 10, wherein at least a portion of the control inputs are programmed.

18. The logic circuit of claim 17, wherein the programmed control inputs are programmed using camouflaged circuits.

19. The logic circuit of claim 10, wherein:
the logic output of at least one of the plurality of interconnected building blocks has a logical state being a selectable one of a plurality of logical functions of the remaining of the first input, second input and third inputs, the selectable one of the plurality of logical functions determined at least in part according to which of the first input, the second input, and the third input is configured as the control input.

* * * * *